United States Patent
Zhou

(10) Patent No.: US 10,347,666 B2
(45) Date of Patent: Jul. 9, 2019

(54) METHOD FOR FABRICATING A TFT BACKPLANE AND TFT BACKPLANE

(71) Applicant: Shenzhen China Star Optoelectronics Technology Co., Ltd., Shenzhen, Guangdong (CN)

(72) Inventor: Xingyu Zhou, Guangdong (CN)

(73) Assignee: Shenzhen China Star Optoelectronics Technology Co., Ltd., Shenzhen, Guangdong (CN)

(*) Notice: Subject to any disclaimer, the term of this patent is extended or adjusted under 35 U.S.C. 154(b) by 225 days.

(21) Appl. No.: 15/532,493

(22) PCT Filed: May 12, 2017

(86) PCT No.: PCT/CN2017/084135
§ 371 (c)(1),
(2) Date: Jun. 1, 2017

(87) PCT Pub. No.: WO2018/176589
PCT Pub. Date: Oct. 4, 2018

(65) Prior Publication Data
US 2019/0096973 A1 Mar. 28, 2019

(30) Foreign Application Priority Data
Mar. 30, 2017 (CN) .......................... 2017 1 0203707

(51) Int. Cl.
*H01L 27/12* (2006.01)
*H01L 29/51* (2006.01)
(Continued)

(52) U.S. Cl.
CPC ...... *H01L 27/1251* (2013.01); *H01L 27/3244* (2013.01); *H01L 29/511* (2013.01);
(Continued)

(58) Field of Classification Search
CPC . H01L 29/511; H01L 29/513; H01L 27/1251; H01L 27/3244; H01L 51/56; H01L 51/0529
See application file for complete search history.

(56) References Cited

U.S. PATENT DOCUMENTS 6,080,607 A * 6/2000 Chang ............... H01L 21/28202
257/192
6,096,615 A * 8/2000 Gardner ............ H01L 21/28123
257/E21.206

(Continued)

FOREIGN PATENT DOCUMENTS

CN 105931988 A 9/2016
CN 106057677 A 10/2016
(Continued)

*Primary Examiner* — Joseph C. Nicely
(74) *Attorney, Agent, or Firm* — Andrew C. Cheng

(57) ABSTRACT

The present application discloses a method for fabricating a TFT backplane and a TFT backplane. The method includes: providing a substrate; subsequently forming a first active region, a first oxide layer, a nitride layer and a first and a second gate independently of each other on the substrate; removing the nitride layer not covered by the first and second gate electrodes; depositing a second insulating layer; forming a second active region with different material from the first active region on the on the second insulating layer above the second gate electrode; forming a first and a second source electrodes, a first and a second drain electrodes respectively. This method can improve the performance of the TFT backplane.

16 Claims, 4 Drawing Sheets

(51) Int. Cl.
  *H01L 27/32*    (2006.01)
  *H01L 51/56*    (2006.01)
  *H01L 51/05*    (2006.01)

(52) U.S. Cl.
  CPC ........ *H01L 29/513* (2013.01); *H01L 51/0529* (2013.01); *H01L 51/56* (2013.01)

(56) References Cited

U.S. PATENT DOCUMENTS

| | | | |
|---|---|---|---|
| 10,186,528 B2* | 1/2019 | Lee | H01L 29/7869 |
| 2014/0131703 A1* | 5/2014 | Miyamoto | H01L 27/1225 |
| | | | 257/43 |
| 2014/0159038 A1 | 6/2014 | Im | |
| 2015/0325602 A1 | 11/2015 | Im | |
| 2017/0133446 A1* | 5/2017 | Hsu | H01L 27/12 |
| 2018/0308879 A1* | 10/2018 | Liu | H01L 27/1288 |
| 2019/0035824 A1* | 1/2019 | Saitoh | G09F 9/00 |

FOREIGN PATENT DOCUMENTS

| | | |
|---|---|---|
| CN | 106098628 A | 11/2016 |
| CN | 106298648 A | 1/2017 |
| JP | 1996037307 A | 2/1996 |

* cited by examiner

US 10,347,666 B2

METHOD FOR FABRICATING A TFT BACKPLANE AND TFT BACKPLANE

FIELD OF THE INVENTION

The present application relates to the field of display technology, and more particularly to a method for fabricating a TFT backplane and TFT backplane.

BACKGROUND OF THE INVENTION

Organic Light-Emitting Diode, OLED display apparatus, also known as organic electroluminescent display apparatus, it is a new flat panel display apparatus, because of its advantages of simple fabrication process, low cost, low power consumption, high luminous brightness, adaptation to a wide working temperature range, thin volume, fast response time, and easy to achieve color display and large screen display, easy to achieve matching with integrated circuit drivers, easy to achieve flexible display, etc., and thus has broad application prospects. The OLED, according to the driving methods, can be divided into two categories of passive matrix OLED type and active matrix OLED, AMO-LED.

Thin Film Transistor, TFT is the main driving element in the AMOLED display apparatus, which is directly related to the development direction of high performance flat panel display apparatus. The existing TFT backplane has variety kind of structures, and the material of the active layer of the thin film transistor to fabricate the corresponding structure also has variety kinds of materials. For example, in the same TFT backplane, it is possible to simultaneously use a polysilicon material having high electron mobility and a uniformly current outputting, and a non-polysilicon material having a fast switching speed and a low current leakage to form a driver TFT and a switching TFT, respectively. The TFT backplane can select to use different TFTs depending on the different requirement of functions.

However, the inventors of the present application have found from the long term research, within the conventional technology, in order to improve the reliability and electrical performance of the driver TFT, the gate insulating layer of the TFT is used as the structure of the oxide plus nitride, however, in the high temperature process of the TFT after the deposition of the nitride, the nitride will diffuse, which will contaminate the non-polysilicon material of the switching TFT, thus affecting the performance of switching TFT with non-polysilicon material and reducing the performance of the entire TFT backplane.

SUMMARY OF THE INVENTION

The technical problem mainly solved by the present application is to provide a method for fabricating a TFT backplane and a TFT backplane to reduce the influence of the nitride layer of the driver TFT to the performance of the switching TFT, thereby enhancing the performance of the TFT backplane.

In order to solve the above technical problems, a technical proposal adopted in the present application is providing a method for fabricating a TFT backplane, the method including: providing a substrate; forming a first active region on the substrate, wherein the first active region is a polysilicon material; depositing an oxide layer and a nitride layer sequentially on the first active region and on the substrate not covered by the first active region to form as a first insulating layer; forming a first gate electrode and a second gate electrode independently to each other on the nitride layer, respectively, and the first gate electrode is positioned above the first active region; removing the nitride layer not covered by the first gate electrode and the second gate electrode by dry etching with the self-alignment of the first gate electrode and the second gate electrode; depositing a second insulating layer on the first gate electrode and the second gate electrode and the oxide layer not covered by the nitride layer; forming a second active region on the second insulating layer above the second gate electrode, wherein the materials of the second active region is different from the material of the first active region; and forming a first source electrode, a first drain electrode, a second source, and a second drain for the first active region and the second active region, respectively.

In order to solve the above technical problems, another technical proposal adopted in the present application is providing a method for fabricating a TFT backplane, the method including:

providing a substrate; forming a first active region on the substrate, wherein the first active region is a polysilicon material; depositing an oxide layer and a nitride layer sequentially on the first active region and on the substrate not covered by the first active region to form as a first insulating layer; forming a first gate electrode and a second gate electrode independently to each other on the nitride layer, respectively, and the first gate electrode is positioned above the first active region; removing the nitride layer not covered by the first gate electrode and the second gate electrode; depositing a second insulating layer on the first gate electrode and the second gate electrode and the oxide layer not covered by the nitride layer; forming a second active region on the second insulating layer above the second gate electrode, wherein the materials of the second active region is different from the material of the first active region; and forming a first source electrode, a first drain electrode, a second source, and a second drain for the first active region and the second active region, respectively.

In order to solve the above technical problems, another technical proposal adopted in the present application is providing a TFT backplane, the TFT backplane, including: a substrate; a first active region disposed on the substrate, wherein the first active region is a polysilicon material; a first insulating layer disposed on the first active region and on the substrate not covered by the first active region, wherein the first insulating layer including a sequentially deposited oxide layer and a nitride layer; and the nitride layer including a first nitride layer and a second nitride layer independently to each other; a first gate electrode and a second gate electrode disposed on the first nitride layer and the second nitride layer, respectively; the nitride layer is present only between the first gate electrode, the second gate electrode and the oxide layer; a second insulating layer disposed on the first gate electrode, the second gate electrode and the oxide layer not covered by the nitride layer; a second active region disposed on the second insulating layer above the second gate electrode, wherein the material of the second active region is different from the material of the first active region; a source electrode and a first drain electrode connected to the two terminals of the first active region, respectively; and a second source electrode and a second drain electrode connected to the two terminals of the second active region, respectively.

The advantages of the embodiments of the present application is, compared to the conventional technology, the embodiments of the present application form a first active region on the substrate, the first active region is a polysilicon material; depositing a first oxide layer and a nitride layer sequentially to form a first insulating layer; removing the nitride layer on which the first and second gate electrodes are not covered on the oxide layer, and forming a second active region on the second insulating layer above the second gate. It can be understood that the unremoved nitride layer is only present between the oxide layer and the first and second gate electrodes, and the unremoved nitride is diffused in the subsequent high temperature process of the TFT substrate (the nitride is diffused upward at a high temperature, the diffusion is blocked by the first and second gate electrodes, so that the embodiment of the present application can significantly reduce the contamination of the second active region of the switching TFT by the nitride layer of the driver TFT, thereby reducing its influence to the performance of the switching TFT, thereby enhancing the performance of the TFT backplane.

BRIEF DESCRIPTION OF THE DRAWINGS

In order to more clearly illustrate the embodiments of the present application or conventional technology, the following FIG.s will be described in the embodiments are briefly introduced. It is obvious that the drawings are merely some embodiments of the present application, those of ordinary skill in this field can obtain other FIG.s according to these FIG.s without paying the premise.

DETAILED DESCRIPTION OF PREFERRED EMBODIMENTS

Figure 1:
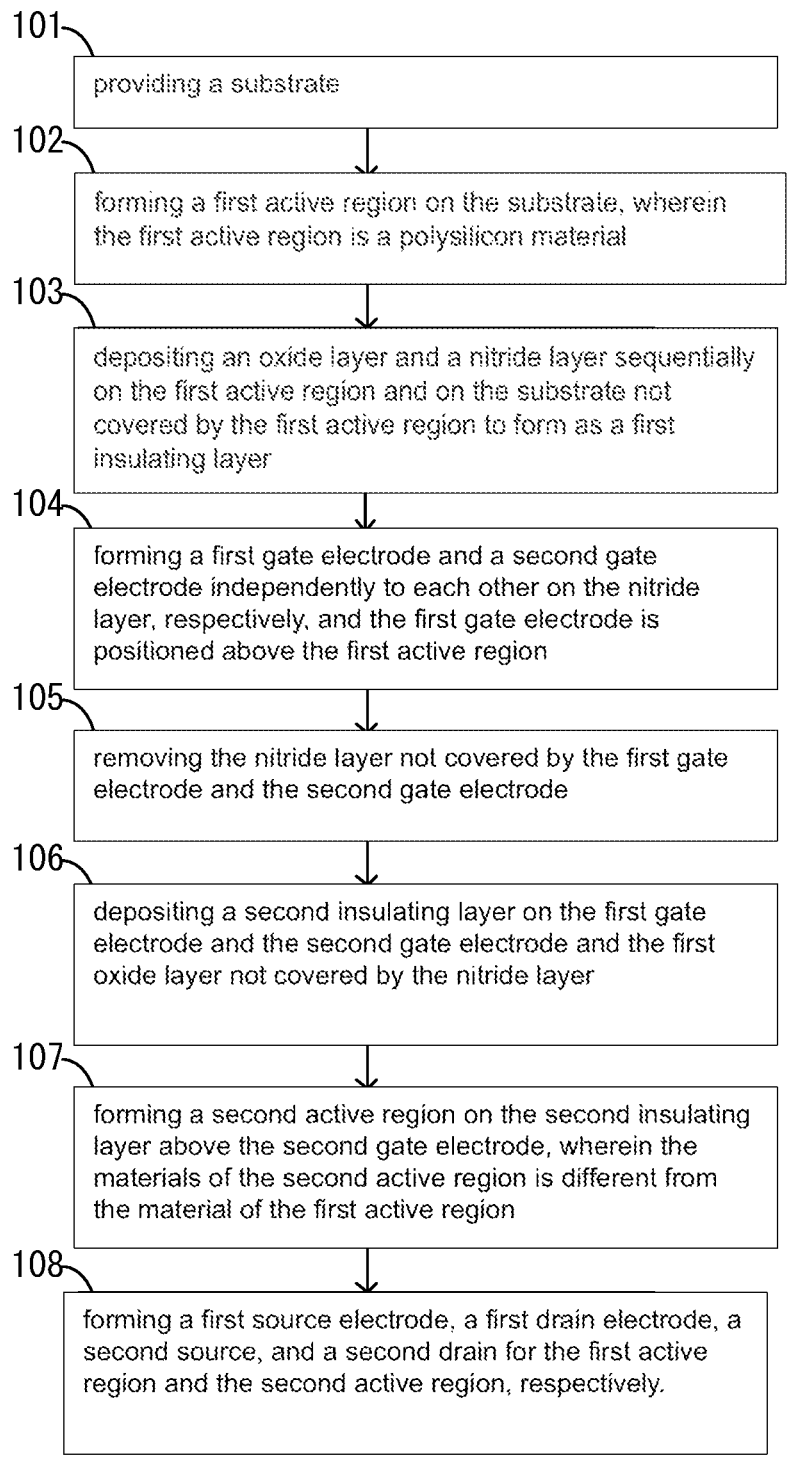
FIG. 1 is a schematic flow diagram of an embodiment of a method for fabricating a TFT backplane.

Embodiments of the present application are described in detail with the technical matters, structural features, achieved objects, and effects with reference to the accompanying drawings as follows. It is clear that the described embodiments are part of embodiments of the present application, but not all embodiments. Based on the embodiments of the present application, all other embodiments to those of ordinary skill in the premise of no creative efforts acquired should be considered within the scope of protection of the present application.

Specifically, the terminologies in the embodiments of the present application are merely for describing the purpose of the certain embodiment, but not to limit the invention.

Figure 2A:
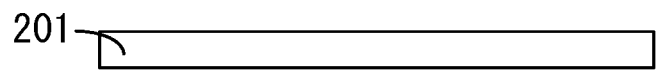
FIG. 2A is a schematic view of the structure of the substrate of the embodiment of FIG. 1.
Figure 2B:
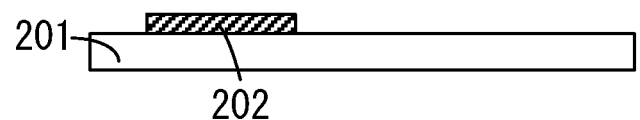
FIG. 2B is a schematic view of the structure of the TFT backplane after the formation of the first active region in the embodiment of FIG. 1.

Combining referring to FIGS. 1 and 2A-2H, FIG. 1 is a schematic flow diagram of an embodiment of a method for fabricating a TFT backplane; FIGS. 2A-2H is a schematic view of the structure of the substrate of the embodiment of FIG. 1. It is to be noted that, in the present embodiment, a first active region 202, a first gate electrode 205, a first source electrode 209, and a first drain electrode 230 are corresponding to a driver TFT, and accordingly, a second active region 208, a second gate electrode 206, a second source electrode 231, and a second drain electrode 232 are corresponding to a switching TFT. The present embodiment includes the following steps:

Step 101: preparing a substrate 201(referring to FIG. 2A).

In an application scenario, the present embodiment requires cleaning and prebaking of the substrate 201 for the purpose of removing the dirty spots, oil and fibers on the substrate 201 to achieve the best effect of the coating adhesive; the purpose of prebaking is to make better uniformity of the coating adhesive.

The substrate 201 of the present embodiment can be, but is not limited to, transparent glass, transparent resin, or the like.

Step 102: forming a first active region 202 on the substrate 201 (referring to FIG. 2B); wherein the first active region 202 is a polysilicon material.

The first active region 202 of the present embodiment includes a source region, a drain region, and a conductive channel (not shown). In an application scenario, the present embodiment by depositing amorphous silicon first, then heating, rapidly annealing or laser crystallizing the amorphous silicon, and finally forms a first active region 202 by the method of photolithography and etching.

Figure 2C:
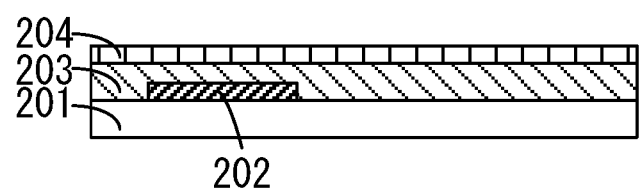
FIG. 2C is a schematic view of the structure of the TFT backplane after the formation of the first insulating layer in the embodiment of FIG. 1.
Figure 2D:
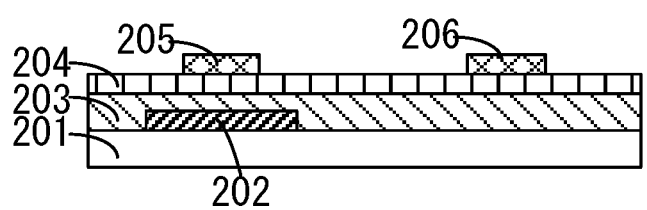
FIG. 2D is a schematic view of the structure of the TFT backplane after the formation of the first and second gate electrodes in the embodiment of FIG. 1.
Figure 2E:
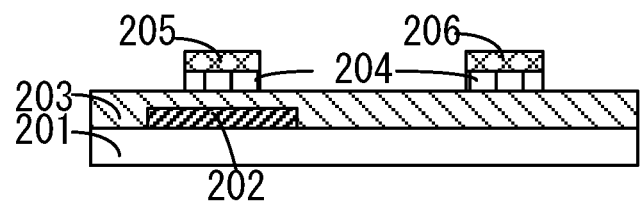
FIG. 2E is a schematic view of the structure of the TFT backplane after the removing of the nitride layer not covered by the first and second gate electrodes in the embodiment of FIG. 1.

Step 103: depositing an oxide layer 203 and a nitride layer 204 sequentially on the first active region 202 and on the substrate 201 not covered by the first active region 202 to form as a first insulating layer (referring to FIG. 2C).

Alternatively, the nitride used in the embodiment is silicon nitride; of course, in other embodiments, other nitrides such as boron nitride can be used instead of silicon nitride.

Step 104: The first gate electrode 205 and the second gate electrode 206 are formed independently to each other on the nitride layer 204, respectively, and the first gate electrode 205 is positioned above the first active region 202 (referring to FIG. 2D).

The first gate electrode 205 and the second gate electrode 206 of the present embodiment are made of metal material and are formed by photolithography and etching. The metal can be copper, aluminum, molybdenum or the like. Of course, in other embodiments, the first gate electrode 205, the second gate electrode 206 can be other metal material or other non-metallic material. The embodiment of the present application does not limit whether the material of the first gate electrode 205 and the second gate electrode 206 is the same or not.

Step 105: Removing the nitride layer 204 where the first gate electrode 205 and the second gate electrode 206 not covered. (referring to FIG. 2E)

Alternatively, the first gate electrode 205 and the second gate electrode 206 of the present embodiment is self-aligned (i.e., a self-alignment process), and the nitride layer 204 not covered by the first gate electrode 205 and the second gate electrode 206 is removed by the dry etch method. Of course, in other embodiments, a process such as an aluminum gate can be used instead of the self-alignment process and/or the wet etching method can be used instead of the dry etching process.

The self-alignment process makes the coverage of the gate, source and drain is by lateral diffusion of the impurities, the coverage capacitance is much smaller than formed by the aluminum gate process. In addition, in the aluminum gate process, even if the aluminum gate electrode is shorter than the channel, it is possible to increase a step of ion implantation process to fill the non-connected part closed to the gate region to achieve self-alignment, in order to reduce the parasitic capacitance, it can improve the switching speed of the TFT and operating frequency, while enhancing the density of integration of the circuit.

This step is mainly to reduce the contamination to the non-polysilicon second active region 208 of the switching TFT (introduced later) by the nitride layer 204 not covered by the first gate electrode 205 and the second gate electrode 206 diffused upward in the subsequent high temperature process of the TFT backplane. The diffusion of the nitride layer 204 covered by the first gate electrode 205 and the second gate electrode 206 is blocked by the first gate electrode 205 and the second gate electrode 206 and does not contaminate the second active region 208, substantially.

Figure 2F:
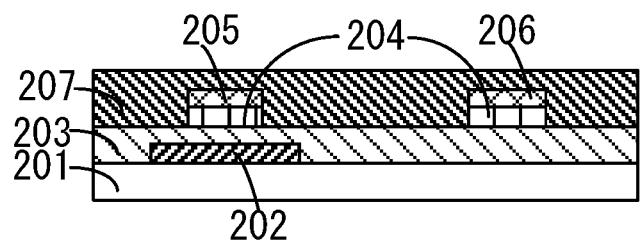
FIG. 2F is a schematic view of the structure of the TFT backplane after the formation of the second insulating layer in the embodiment of FIG. 1.
Figure 2G:
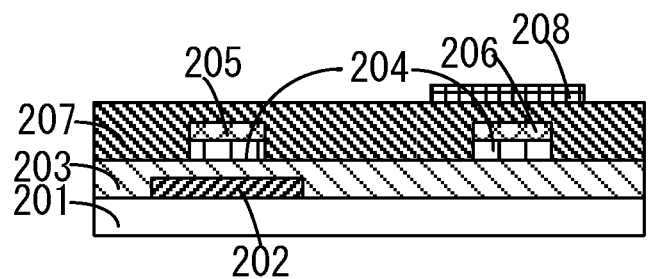
FIG. 2G is a schematic view of the structure of the TFT backplane after the formation of the second active region in the embodiment of FIG. 1.
Figure 2H:
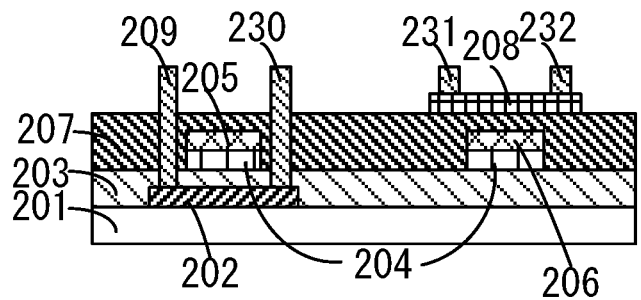
FIG. 2H is a schematic view of the structure of TFT the backplane after the formation of the first and second sources and the first and second drain in the embodiment of FIG. 1.

Step 106: depositing a second insulating layer 207 on the first gate electrode 205 and the second gate electrode 206 and the oxide layer 203 not covered by the nitride layer 204 (referring to FIG. 2F).

In an application scenario, the second insulating layer 207 is silicon dioxide.

Step 107: forming the second active region 208 on the second insulating layer 207 above the second gate electrode 206 (referring to FIG. 2G); wherein the materials to form the second active region 208 is different from the material of the first active region 202.

Alternatively, the second active region 208 of the present embodiment is an oxide material to increase the switching speed of the switching TFT and to reduce its leakage current. The oxide can be, but is not limited to, indium gallium zinc oxide, indium tin zinc oxide, and the like. Of course, in other embodiments, the second active zone 208 can be a non-oxide.

Step 108: fabricating the first source electrode 209, the first drain electrode 230, the second source 231, and the second drain 232 for the first active region 202 and the second active region 208, respectively. (referring to FIG. 2H)

Specifically, the method for fabricating the first source electrode 209, the first drain electrode 230, the second source electrode 231, and the second drain electrode 232 of the present embodiment includes: above the first active region 202, forming through-holes in the second insulating layer 207 and to form a first and a second electrode holes; wherein the first and second electrode holes penetrate the entire second insulating layer 207; depositing a metal layer and etching it to form the first source electrode 209 and the first drain electrode 230 on the second insulating layer 207 and in the first and second electrode holes, and the first source electrode 209 and the first drain electrode 230 are in contacted with the two terminals of the first active region 202 through the first and second electrode holes, respectively, it can be understood that they are in contact with the source and drain regions located at both terminals of the first active region 202, respectively; and the second source electrode 231 and the second drain electrode 232 can be formed on two terminals of the second active region 208 in the same time.

Figure 3:
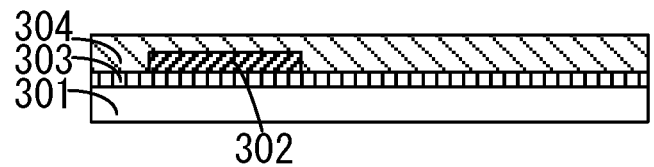
FIG. 3 is a schematic view of another embodiment of the TFT backplane in the fabricating process of the TFT backplane of the present application.

Comparing to the conventional technology, the unremoved nitride layer of the present embodiment is only present between the oxide layer and the first and second gate electrodes, and the diffusion of the unremoved nitride in the subsequent high temperature process of the TFT substrate is blocked by the first and second gate electrodes, so that the embodiment of the present application can significantly reduce the contamination of the second active region of the switching TFT by the nitride layer of the driver TFT, thereby reducing its influence to the performance of the switching TFT, thereby enhancing the performance of the TFT backplane. Alternatively, referring to FIG. 3, FIG. 3 is a schematic view of another embodiment of the TFT backplane in the fabricating process of the TFT backplane of the present application. In the present embodiment, after preparing the substrate 301, before forming the first active region 302 on the substrate 301, a buffer layer 303 is formed on the substrate 301, that is the buffer layer 303 is deposited between the substrate 301 and the first active region 302 and the first insulating layer 304 to improve the current leakage issue during the fabrication of the first active region 302, thereby further enhancing the performance of the TFT substrate. In an application scenario, the buffer layer 303 includes a silicon nitride layer and a silicon oxide layer; of course, in other application scenarios, the buffer layer 303 can also include only a silicon nitride layer or a silicon oxide layer.

Figure 4:
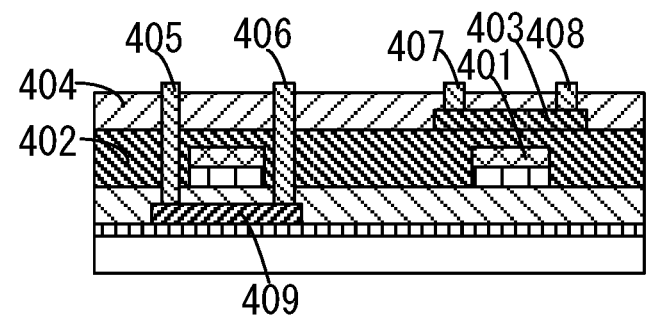
FIG. 4 is a schematic view of another embodiment of the TFT backplane in the fabricating process of the TFT backplane of the present application.

Alternatively, referring to FIG. 4, FIG. 4 is a schematic view of another embodiment of the TFT backplane in the fabricating process of the TFT backplane of the present application. The present embodiment can be substituted for the step 108 of the embodiment of FIG. 1 by the following method. Specifically, after forming the second active region 403 on the second insulating layer 402 above the second gate electrode 401: depositing an etching stop layer 404 on the second active region 403 and on the second insulating layer 402 not covered by the second active region 403; correspondingly, the method for fabricating a first source electrode 405, a first drain electrode 406, and a second source electrode 407, and a second drain electrode 408 includes: above the first active region 410, forming through-holes in the etching stop layer 404 and the second insulating layer 402 and to form a first and a second electrode holes; wherein the first and second electrode holes penetrate the entire etching stop layer 404 and the second insulating layer 402; depositing a metal layer and etching it to form the first source electrode 405 and the first drain electrode 406 on the etching stop layer 404 and the second insulating layer 402 and in the first and second electrode holes, and the first source electrode 407 and the first drain electrode 408 are in contacted with the two terminals of the first active region 409 through the first and second electrode holes, respectively. Above two terminals of the second active region 403, forming through-holes in the etching stop layer 404 and to form a third and a fourth electrode holes and penetrate the etching stop layer 404 above the second active region 403, depositing a metal layer and etching it to form the second source electrode 407 and the second drain electrode 408 on the etching stop layer 404 and in the third and fourth electrode holes, and the second source electrode 407 and the second drain electrode 408 are in contacted with the two terminals of the second active region 403 through the third and fourth electrode holes, respectively.

Of course, the method for fabricating the TFT substrate of the present embodiment also includes some necessary steps, such as fabricating of a passivation layer, a flat layer, a conductive layer, a pixel definition layer and a pixel electrode, which are not the inventive points of the present application and not described in detail.

Figure 5:
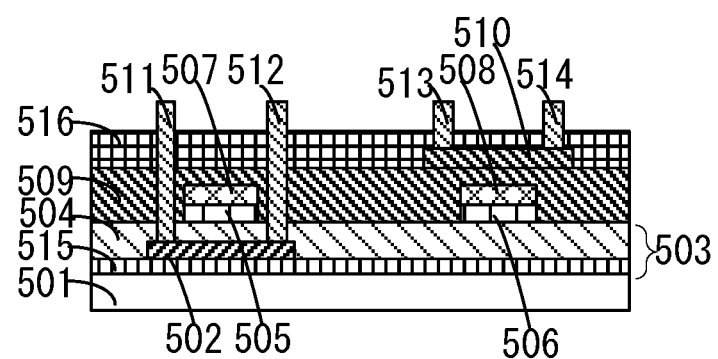
FIG. 5 is a schematic structural view of the TFT backplane in an embodiment of the present application.

Referring to FIG. 5, FIG. 5 is a schematic structural view of the TFT backplane in an embodiment of the present application. The present embodiment includes a substrate 501, a first active region 502 disposed on the substrate 501, wherein the first active region 502 is a polysilicon material; a first insulating layer 503 disposed on the first active region 502 and on the substrate 501 not covered by the first active region 502; wherein the first insulating layer 503 includes a sequentially deposited oxide layer 504 and a nitride layer; and the nitride layer includes a first nitride layer 505 and a second nitride layer 506 independently to each other; a first gate electrode 507 and a second gate electrode 508 disposed on the first nitride layer 505 and the second nitride layer 506, respectively; the nitride layer is present only between the first gate electrode 507, the second gate electrode 508 and the oxide layer 504; a second insulating layer 509 disposed on the first gate electrode 507, the second gate electrode 508 and the oxide layer 504 not covered by the first nitride layer 505 and the second nitride layer 506, a second active region 510 disposed on the second insulating layer 509 above the second gate electrode 508; wherein the material of the second active region 510 is different from the material of the first active region 502; a source electrode 511 and a first drain electrode 512 connected to the two terminals of the first active region 502, respectively; and a second source electrode 513 and a second drain electrode 514 connected to the two terminals of the second active region 510, respectively.

Comparing to the conventional technology, the nitride layer of the driver TFT of the present embodiment is only present between the oxide layer and the first and second gate electrodes, and the diffusion of the unremoved nitride in the subsequent high temperature process of the TFT substrate is blocked by the first and second gate electrodes, so that the embodiment of the present application can significantly reduce the contamination of the second active region of the switching TFT by the nitride layer of the driver TFT, thereby enhancing the performance of the TFT backplane.

Alternatively, the second active region 510 of the present embodiment is an oxide material to increase the switching speed of the switching TFT and to reduce its current leakage. The oxide can be, but is not limited to, indium gallium zinc oxide, indium tin zinc oxide, and the like. Of course, in other embodiments, the second active region 208 can be a non-oxide.

Alternatively, the first gate electrode 507 and the second gate electrode 508 of the present embodiment is self-aligned (i.e., a self-alignment process), and the nitride layer 505 not covered by the first gate electrode 507 and the second gate electrode 508 is removed by the dry etch method. Of course, in other embodiments, a process such as an aluminum gate can be used instead of the self-alignment process and/or the wet etching method can be used instead of the dry etching process.

Alternatively, the nitride of this embodiment is silicon nitride; of course, in other embodiments, other nitrides such as boron nitride can be used instead of silicon nitride.

Alternatively, the present embodiment further includes: depositing a buffer layer 515 between the substrate 501 and the first active interval 502 to improve the leakage issue when fabricating the first active region 502, thereby further enhancing the performance of the TFT substrate. In an application scenario, the buffer layer 515 includes a silicon nitride layer and a silicon oxide layer; of course, in other application scenarios, the buffer layer 515 can only include silicon nitride layers or silicon oxide layers; or adapting other materials to replace nitride silicon and/or silicon oxide.

Alternatively, the present embodiment further includes an etching stop layer 516 disposed on the second insulating layer 509 to provide support for realizing the non-back channel etching of the second source 513 and the second drain 514.

Of course, the method for fabricating the TFT substrate of the present embodiment also includes some necessary steps, such as fabricating of a passivation layer, a flat layer, a conductive layer, a pixel definition layer and a pixel electrode, which are not the inventive points of the present application and not described in detail.

It is to be noted that the first source electrode, the first drain electrode, the second source electrode, and the second drain electrode of the present embodiment can be metals such as copper, aluminum, and molybdenum. Of course, other metals or other non-metallic materials can be used in place of these metals. And the embodiment of the present application does not limit the material of the first source, the first drain, the second source, the second drain, the first gate, and the second gate is the same.

Above are embodiments of the present application, which does not limit the scope of the present application. Any modifications, equivalent replacements or improvements within the spirit and principles of the embodiment described above should be covered by the protected scope of the invention.

What is claimed is:

1. A method for fabricating a TFT backplane, comprising:
   providing a substrate;
   forming a first active region on the substrate, wherein the first active region is a polysilicon material;
   depositing an oxide layer and a nitride layer sequentially on the first active region and on the substrate not covered by the first active region to form as a first insulating layer;
   forming a first gate electrode and a second gate electrode independently to each other on the nitride layer, respectively, and the first gate electrode is positioned above the first active region;
   removing the nitride layer not covered by the first gate electrode and the second gate electrode by dry etching with the self-alignment of the first gate electrode and the second gate electrode;
   depositing a second insulating layer on the first gate electrode and the second gate electrode and the oxide layer not covered by the nitride layer;
   forming a second active region on the second insulating layer above the second gate electrode, wherein the materials of the second active region is different from the material of the first active region; and
   forming a first source electrode, a first drain electrode, a second source, and a second drain for the first active region and the second active region, respectively.

2. The method for fabricating a TFT backplane according to claim 1, wherein after providing the substrate and before forming the first active region on the substrate further comprising:
forming a buffer layer, wherein the buffer layer comprising a silicon nitride layer and/or a silicon oxide layer.

3. The method for fabricating a TFT backplane according to claim 1, wherein the nitride is SiN.

4. The method for fabricating a TFT backplane according to claim 1, wherein after depositing the second insulating layer on the first gate electrode and the second gate electrode and the oxide layer not covered by the nitride layer and before forming the second active region on the second insulating layer above the second gate electrode further comprising: forming an etching stop layer on the second insulating layer.

5. A method for fabricating a TFT backplane, comprising:
providing a substrate;
forming a first active region on the substrate, wherein the first active region is a polysilicon material;
depositing an oxide layer and a nitride layer sequentially on the first active region and on the substrate not covered by the first active region to form as a first insulating layer;
forming a first gate electrode and a second gate electrode independently to each other on the nitride layer, respectively, and the first gate electrode is positioned above the first active region;
removing the nitride layer not covered by the first gate electrode and the second gate electrode;
depositing a second insulating layer on the first gate electrode and the second gate electrode and the oxide layer not covered by the nitride layer;
forming a second active region on the second insulating layer above the second gate electrode, wherein the materials of the second active region is different from the material of the first active region; and
forming a first source electrode, a first drain electrode, a second source, and a second drain for the first active region and the second active region, respectively.

6. The method for fabricating a TFT backplane according to claim 5, wherein removing the nitride layer not covered by the first gate electrode and the second gate electrode comprising:
taking the first gate electrode and the second gate electrode as self-aligned and performing dry etching to remove the nitride layer not covered by the first gate electrode and the second gate electrode.

7. The method for fabricating a TFT backplane according to claim 5, wherein the second active region is oxide material.

8. The method for fabricating a TFT backplane according to claim 5, wherein after providing the substrate and before forming the first active region on the substrate further comprising:
forming a buffer layer, wherein the buffer layer comprising a silicon nitride layer and/or a silicon oxide layer.

9. The method for fabricating a TFT backplane according to claim 5, wherein the nitride is SiN.

10. The method for fabricating a TFT backplane according to claim 5, wherein after depositing the second insulating layer on the first gate electrode and the second gate electrode and the oxide layer not covered by the nitride layer and before forming the second active region on the second insulating layer above the second gate electrode further comprising: forming an etching stop layer on the second insulating layer.

11. A TFT backplane, comprising:
a substrate;
a first active region disposed on the substrate, wherein the first active region is a polysilicon material;
a first insulating layer disposed on the first active region and on the substrate not covered by the first active region, wherein the first insulating layer comprising a sequentially deposited oxide layer and a nitride layer; and the nitride layer comprising a first nitride layer and a second nitride layer independently to each other;
a first gate electrode and a second gate electrode disposed on the first nitride layer and the second nitride layer, respectively; the nitride layer is present only between the first gate electrode, the second gate electrode and the oxide layer;
a second insulating layer disposed on the first gate electrode, the second gate electrode and the oxide layer not covered by the nitride layer;
a second active region disposed on the second insulating layer above the second gate electrode, wherein the material of the second active region is different from the material of the first active region;
a source electrode and a first drain electrode connected to the two terminals of the first active region, respectively; and
a second source electrode and a second drain electrode connected to the two terminals of the second active region, respectively.

12. The TFT backplane according to claim 11, wherein the second active region is oxide material.

13. The TFT backplane according to claim 11, wherein the first nitride layer and the second nitride layer are formed by taking the first gate electrode and the second gate electrode as self-alignment and removing the nitride layer not covered by the first gate electrode and the second gate electrode by dry etching.

14. The TFT backplane according to claim 11 further comprising: a buffer layer disposed between the substrate and the first active region, wherein the buffer layer comprising a silicon nitride layer and/or a silicon oxide layer.

15. The TFT backplane according to claim 11, wherein the nitride is SiN.

16. The TFT backplane according to claim 11, wherein after depositing the second insulating layer on the first gate electrode and the second gate electrode and the oxide layer not covered by the nitride layer and before forming the second active region on the second insulating layer above the second gate electrode further comprising: an etching stop layer formed on the second insulating layer.

* * * * *